United States Patent [19]

Kashiwabara et al.

[11] Patent Number: 5,170,115
[45] Date of Patent: Dec. 8, 1992

[54] SAMPLING TYPE MEASURING DEVICE

[75] Inventors: Yukio Kashiwabara; Yukiyoshi Hiraishi; Eiichi Goto, all of Tokyo, Japan

[73] Assignee: Yokogawa Electric Corporation, Tokyo, Japan

[21] Appl. No.: 696,393

[22] Filed: May 6, 1991

[30] Foreign Application Priority Data

Aug. 23, 1990 [JP] Japan .................................. 2-222100
Aug. 24, 1990 [JP] Japan .................................. 2-222722
Aug. 27, 1990 [JP] Japan .................................. 2-224915

[51] Int. Cl.$^5$ .......................................... G01R 21/133
[52] U.S. Cl. ..................................... 324/142; 364/483
[58] Field of Search ...................... 324/142, 141, 111; 364/483

[56] References Cited

U.S. PATENT DOCUMENTS 4,752,731  6/1988  Toda ..................................... 324/142
4,992,725  2/1991  Komatsu et al. ..................... 324/142
5,081,413  1/1992  Yamada et al. ...................... 324/142

Primary Examiner—Ernest F. Karlsen
Attorney, Agent, or Firm—Moonray Kojima

[57] ABSTRACT

A sampling type measuring device wherein an analog signal is measured by sampling the analog signal, converting each value obtained by sampling into digital form, and then processing the digital values. Exponential averaging calculation is performed directly on the digital values. Thus, no provision or time is needed to regulate the sampling period, thereby shortening the time required to perform measurement.

1 Claim, 14 Drawing Sheets

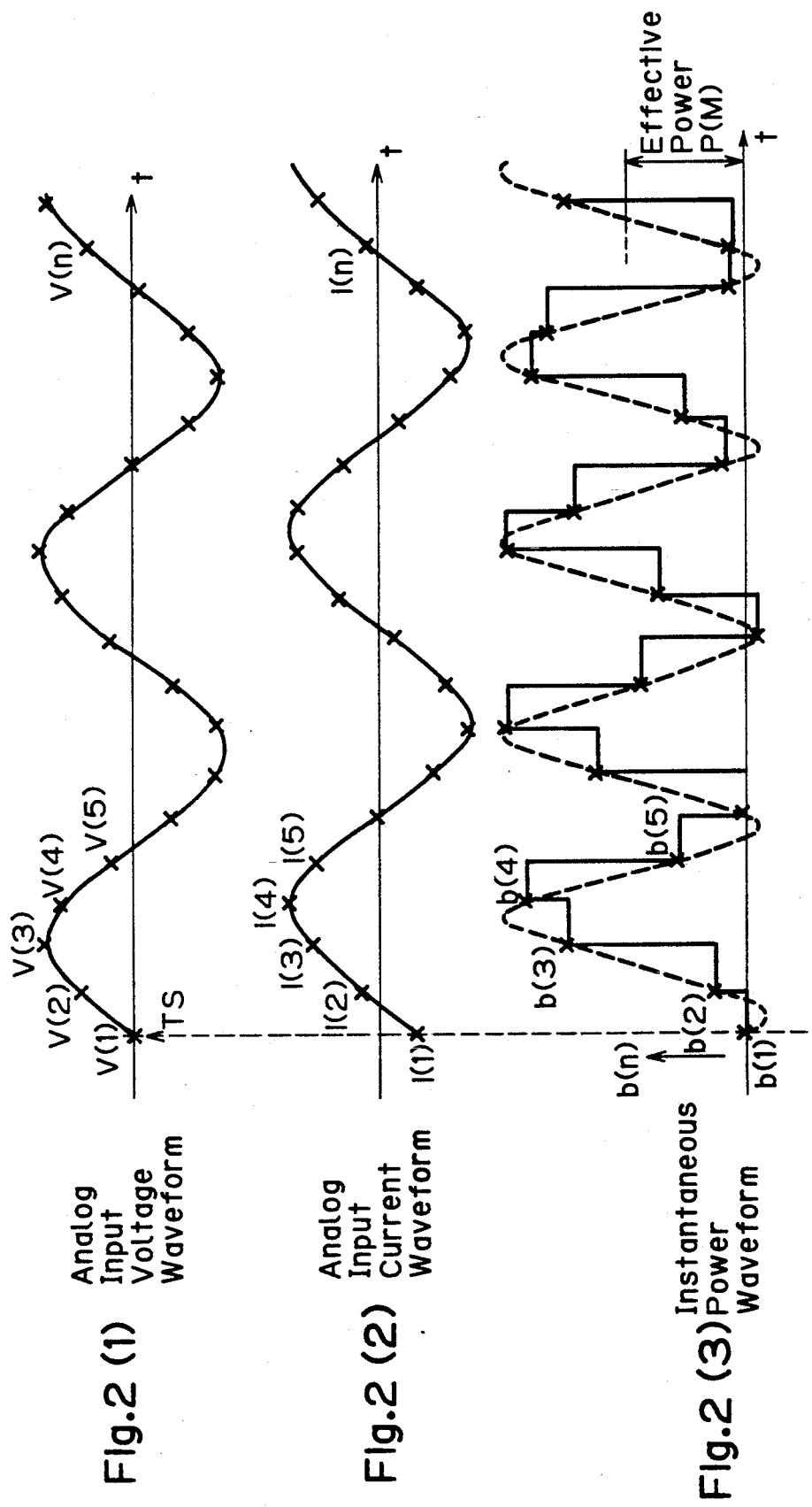

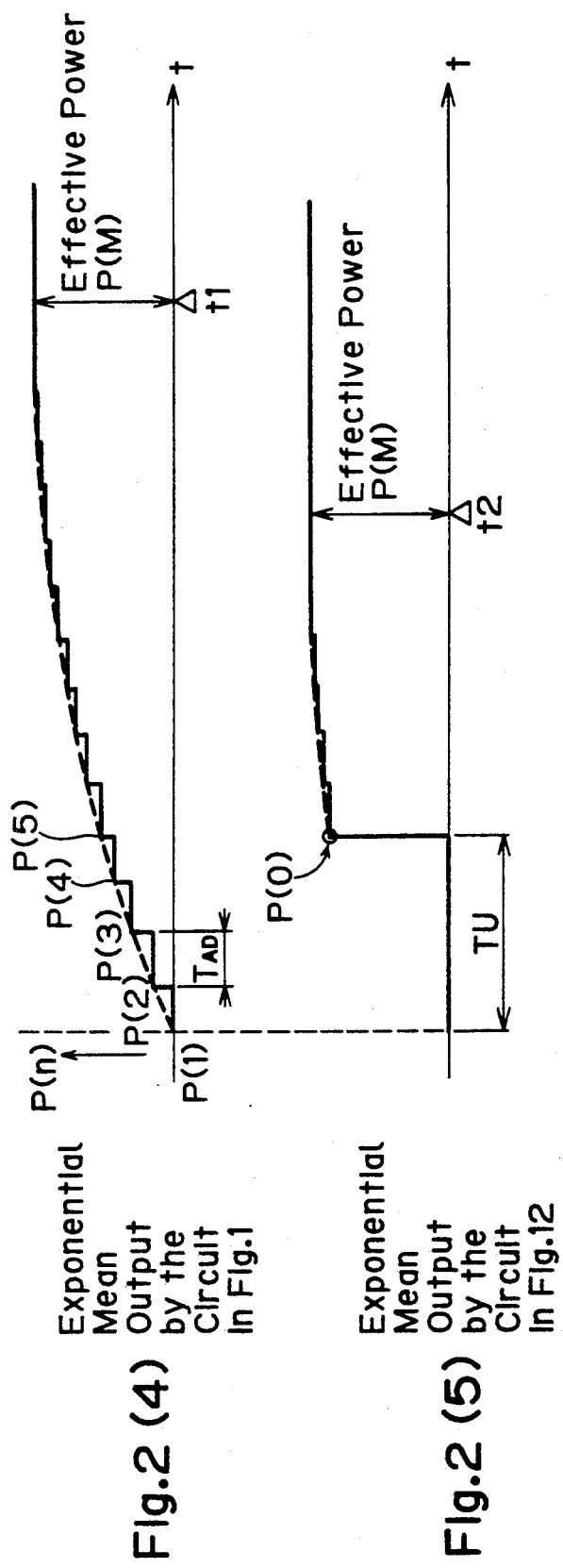

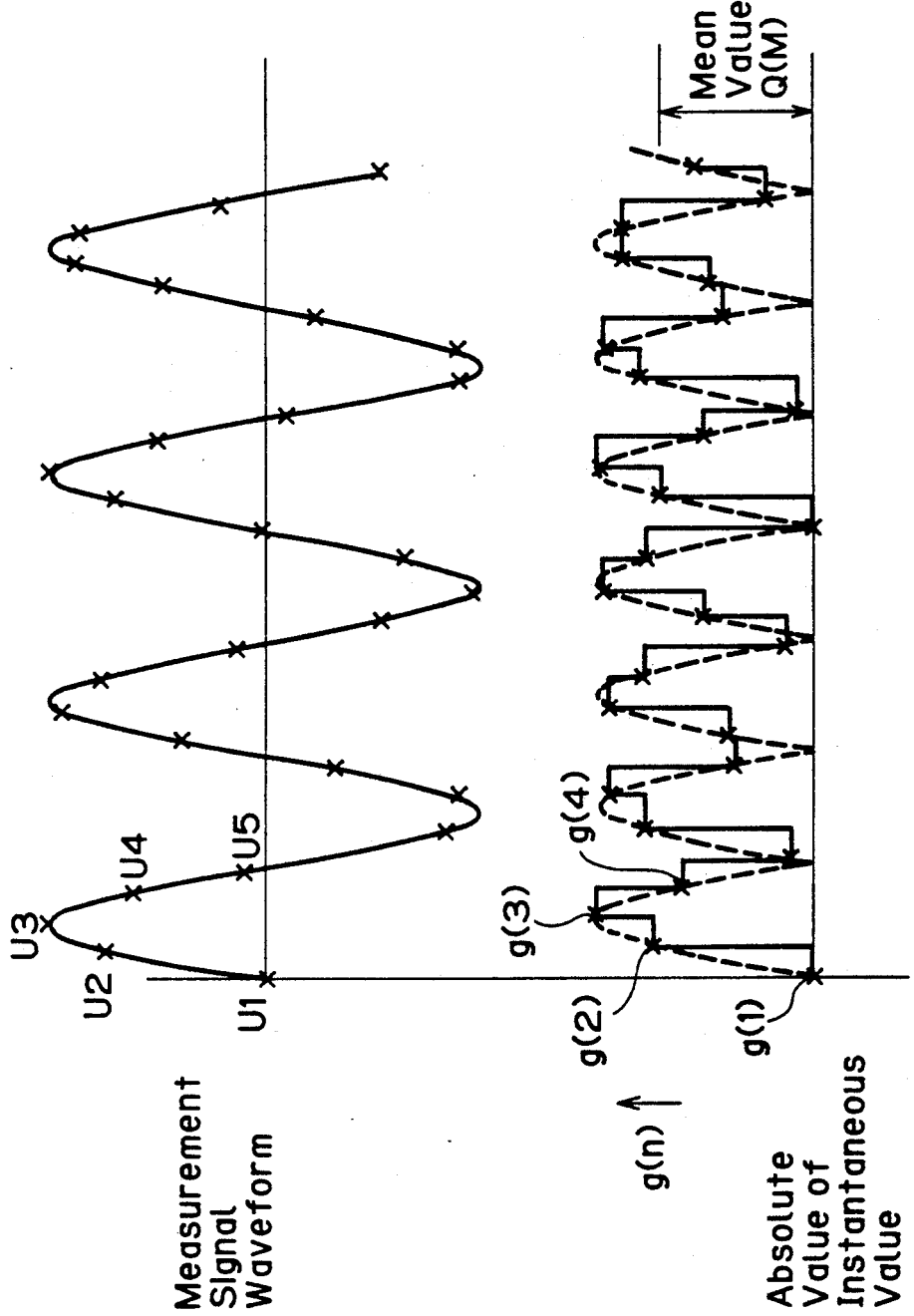

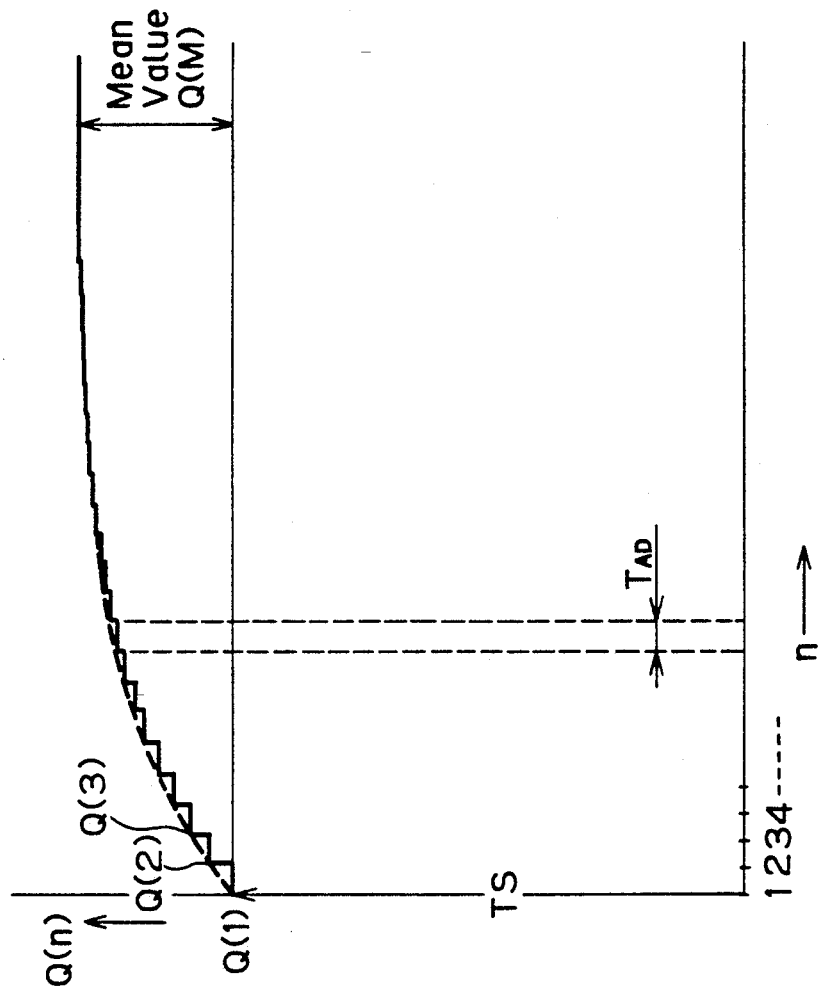

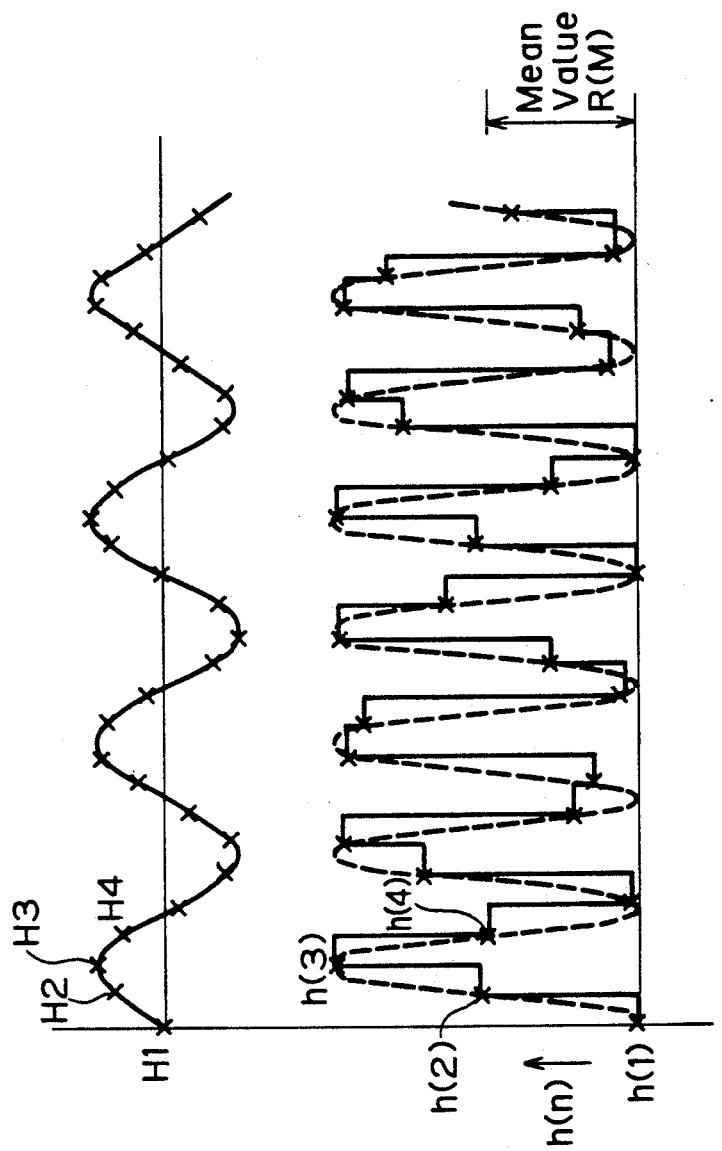

SAMPLING TYPE MEASURING DEVICE

BACKGROUND OF THE INVENTION

1. Field of Invention

This invention relates to a sampling type measuring device which measures an analog input signal by sampling an analog input signal at a certain period, converting each sample value into digital form, and then processing the digital values.

2. Description of the prior art

The prior art will first be described, taking as an example, a sampling type wattmeter. In conventional wattmeters, an effective power value is obtained by sampling an input voltage waveform and an input current waveform by using an analog-digital converters (hereinafter referred to as AD converter) for converting an analog signal to digital form and multiplying together the sampled values. Therefore, the obtained power value involves an error if the integral multiple of one cycle of the input waveform is out of accord with the integral multiple of a sampling period.

The reason for the error will be discussed with reference to FIG. 7. In conventional sampling wattmeters, the effective power value W (the mean value of instantaneous power values, $V_n \cdot I_n$) is obtained by the following arithmetic averaging calculations.

$$W = \frac{1}{N} \sum_{n=1}^{N} V_n \cdot I_n \quad (1)$$

wherein $V_n$ is the sampled value of input voltage, $I_n$ is the sampled value of input current, and N is the sampling number, that is the number of samples taken.

In the waveform shown in FIG. 7, one cycle Tin of the input waveform is out of accord with the integral multiple of a sampling period $T_{AD}$, that is $$n1 \cdot Tin \neq n2 \cdot T_{AD}$$

wherein $n1 = 1, 2, 3 \ldots$; and $n2 = 3, 4, 5 \ldots$. However, there exists the relationship $n2 \geq 2n1 + 1$. This condition prevents sampling of the input waveform at identical phase positions. Thus, a fraction TY appears, as shown in FIG. 7. This fraction TY causes a corresponding error in the effective power value W obtained by arithmetic averaging calculation of Equation (1).

Similar to the case of power measurement, in the measurement of the mean value of rectified waveform, or effective value of an analog input signal by sampling, if a fraction such as TY shown in FIG. 7 appears, there arises a corresponding error.

To reduce adverse influence due to the fraction TY, the following techniques may be used.

1. To regulate the sampling period $T_{AD}$ relative to the input waveform such that $n1 \cdot Tin = n2 \cdot T_{AD}$.
2. To sample the input signal or waveform over several cycles until the following relationship is reached: $n1 \cdot Tin = n2 \cdot T_{AD}$.
3. To shorten the sampling period $T_{AD}$ to considerably decrease the fraction TY relative to one cycle Tin of the input waveform, thereby decreasing the error.
4. To increase the sampling number N (see equation (1)) to relatively decrease the influence due to fraction TY.

The foregoing four methods, however, have the following disadvantages.

1. In the first method, a phase-locked circuit for regulating the sampling period $T_{AD}$ must have a wide frequency variable range. Thus, the circuit configuration becomes complicated, and leads to high cost.
2. In the second method, measurement cannot be done before an interval corresponding to the integral multiple of one cycle Tin of the input waveform comes into accord with that corresponding to the integral multiple of the sampling period $T_{AD}$. Thus, the response time of measurement becomes long.
3. In the third method, an AD converter must be of the high speed type in order to successively process the values picked up at short intervals. Thus, the circuit costs increase.
4. In the fourth method, where the input waveform changes from one value W1 to another W2, the second value W2 cannot be measured quickly in time.

The reason for the above defect will be described by taking the condition that an effective power value W1 has been obtained by processing, in accordance with equation (1) with 1000 values picked up by 1000 samples. In this case, if the input waveform changes to a different value W2 after the sampling number reaches 1000, the then calculated value cannot easily reach the new value W2 because the influence of the sum of the values corresponding to the first to the thousandth samples is significant. That is, since the sum of the values corresponding to the first to thousandth samples is very large, even when the then sampled values corresponding to the thousandth and first and subsequent samples are added to the last sum in equation (1), the sum ($\Sigma$) changes little. Thus, a large number of samples must be obtained until the new value W2 is actually calculated.

SUMMARY OF THE INVENTION

An object of the invention is to overcome the aforementioned and other deficiencies and disadvantages of the prior art.

Another object is to provide a sampling type measuring device capable of accurately measuring an analog input signal without the need to regulate the sampling period $T_{AD}$.

A further object is to provide a sampling type measuring device capable of quick measurement without waiting for an interval corresponding to the integral multiple of one cycle Tin of an input waveform to come into accord with that corresponding to the integral multiple of a sampling period $T_{AD}$.

A still further object is to provide a sampling type measuring device capable of measuring an analog input signal without the need for a high speed analog-digital converter.

Another object is to provide a sampling type measuring device capable of measuring a new value of a measurement signal comparatively quickly.

According to the invention, each sampled value is processed in arithmetic units, such as multiplier, absolute value arithmetic unit, and square arithmetic unit, to provide a corresponding digital value. The thus obtained digital value represents the instantaneous value of a measurement signal, i.e. a signal to be measured, and hence varies from sampling moment to moment according to the measurement signal. To attain accurate measurement, it is necessary to calculate the mean value of instantaneous values. According to the invention, these instantaneous values, in digital form, are applied directly to an averaging means. This averaging means provides the mean value of the instantaneous values by repeatedly performing exponential averaging calculation a certain number of times.

BRIEF DESCRIPTION OF THE DRAWINGS

FIGS. 2(1)-2(5) are waveform diagrams depicting signal waveforms at several points in the embodiment of FIG. 1.

FIGS. 9(1)-9(4) are waveform diagrams depicting signal waveforms at several points in the embodiment of FIG. 8.

DETAILED DESCRIPTION OF THE PREFERRED EMBODIMENTS.

Figure 1:
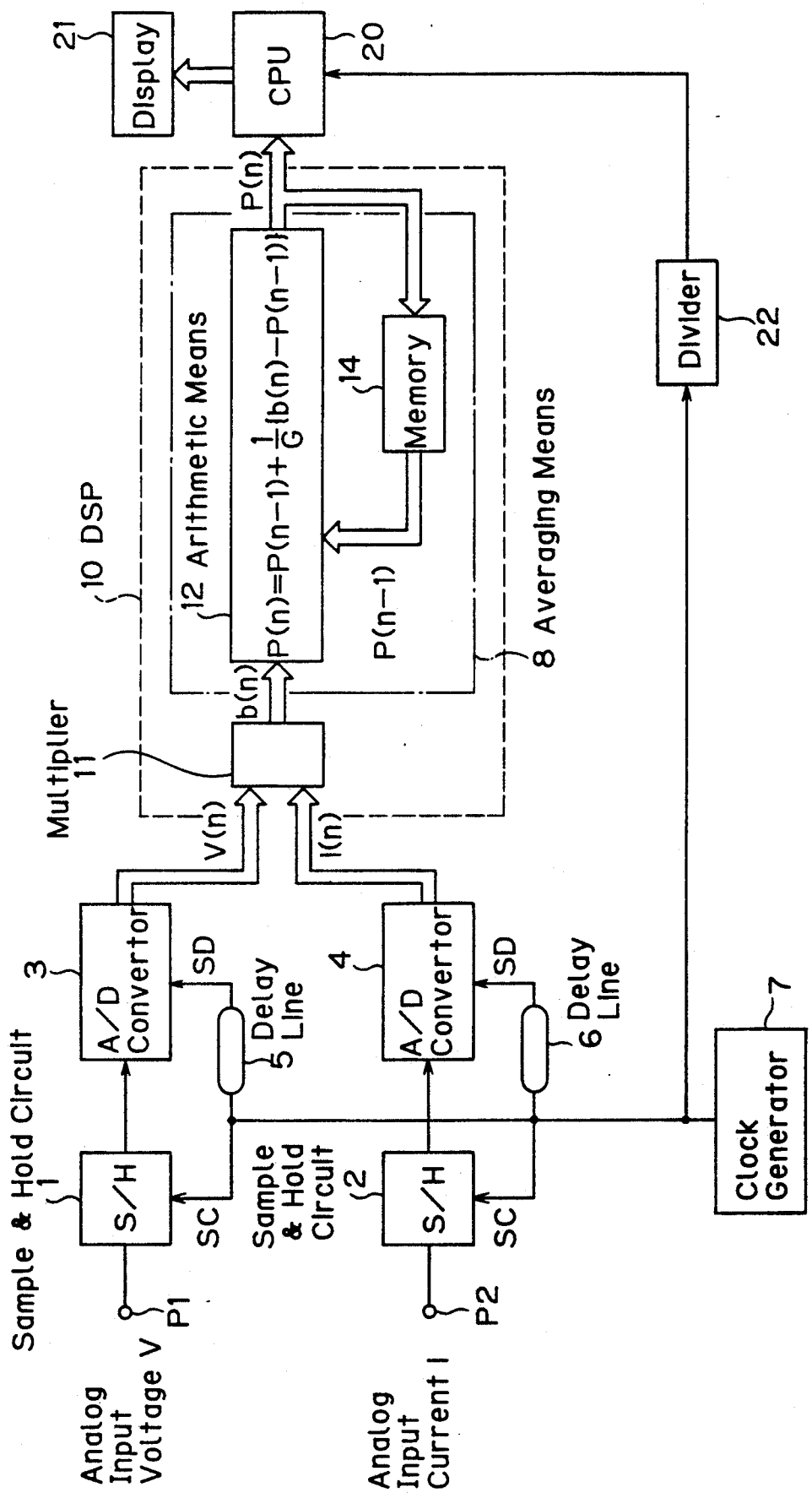
FIG. 1 is a block diagram depicting an illustrative embodiment of the invention as embodied in the form of a wattmeter.

In FIG. 1, a measurement signal or analog input voltage V is applied to a terminal P1, and another measurement signal or analog input current i is applied to another terminal P2. Analog input voltage V (see waveform of FIG. 2(1)) applied to terminal P1 is sent to a sample/hold circuit 1 (called S/H circuit).

A clock generator 7 provides a clock signal SC of a certain period $T_{AD}$ which is supplied to S/H circuits 1,2, delay lines 5,6, and frequency divider 22 (called "divider"). Clock generator 7 may be a conventional circuit, for example, a crystal oscillator, not shown.

A delay line 5 (or 6) functions to delay the clock signal SC and may comprise a combination of inductor and capacitor.

S/H circuit 1 samples the analog input voltage V upon receipt of each clock signal SC from clock generator 7, to pick up the instantaneous value V(n) of analog input voltage V corresponding in timing to each clock reception, and provides the just sampled value in place of the old one. In FIG. 2(1), the mark "x" indicates each sampling point.

An analog to digital (A/D) converter (called ADC) 3 converts the analog signal from the S/H circuit 1 into digital form. Specifically, upon receipt of a start signal SD which is the clock signal SC delayed by the delay line 5, the ADC 3 converts signal supplied from S/H circuit 1 into digital form. The term "analogdigital converter means" used in the claims may also represent a combination of S/H circuit 1 and ADC 3.

The terminal P2 is connected to components identical in function with those connected to terminal P1. That is, S/H circuit 2 connected to the terminal P2 corresponds to the S/H circuit 1, ADC 4 connected to S/H circuit 2 corresponds to ADC 3, and a delay line 6 corresponds to delay line 5.

In general, the analog input current i (see waveform of FIG. 2(2)) is supplied to S/H circuit 2, after being converted into a voltage signal Vi. Specifically, when analog input current i is caused to flow through a shunt resistor , not shown, of known resistance RS, a voltage Vi 9=RS·i) is generated. Since the resistance RS of the shunt resistor is known, measuring the analog input current is equivalent to measuring the voltage Vi in consideration of the relationship i=Vi/RS. In the specification, voltage signal Vi, which is a transformation of the analog input current i is also referred to as analog input current i.

The S/H circuit 2 is applied with the same clock signal Sc as supplied to the S/H circuit 1, and thus, performs sampling on the analog input current i at the same sampling timing as of the S/H circuit 1.

A multiplier 11 receives value V(n) from the ADC 3 and value i(n) from the ADC 4 (these two values correspond to the same sampling moment or n-th sampling) and multiplies the two values together to provide a value b(n)=V(n) i(n). The resulting product b(n) represents an instantaneous power value corresponding to the n-th sampling action. The output of multiplier 11 is in digital form and will be plotted in the form of the solid line waveform of FIG.2(3). Since multiplication is performed on the two sampled values, the resulting product changes stepwise. The dotted line waveform shown in FIG. 2(3) represents the ideal product of the two waveforms shown in FIGS. 2(1) and 2(2).

An averaging means 8 receives both the instantaneous power value b(n) from multiplier 11 and a last mean value P(n-1) calculated by itself which covers the n-1 sampling, and calculates the below equations (2) using a present constant 1/G to provide the new/ present mean value P(n) covering the n samplings. Calculation of equation (2) is referred to as exponential averaging calculation.

Averaging means 8 may comprise a combination of arithmetic means 12 and memory 14.

Arithmetic means 12 performs exponential averaging calculation on value b(n) from multiplier 11. Specifically, upon receipt of each vlaue from multiplier 11, arithmetic means 12 performs calculation of equation (2). That is, arithmetic means 12 receives instantaneous power value b(n) corresponding to the n-th sampling, receives from memory 14 the last mean value P(n-1) calculated by itself which covers the n-1 sampling, and performs calculation of equation (2) using present constant 1/G, thereby providing present mean value P(n) covering the n samplings. This new mean value P(n) is stored in memory 14 and when value P(n) is sufficiently stabilized, this value is also sent to CPU 20.

$$P(n)=P(n-1)+(1/G)\cdot\{b(n)-p(n-1)\} \quad (2)$$

wherein P(n) is the exponential mean value covering n samplings, P(n-1) is the exponential mean value covering n−1 samplings, b(n) is the instantaneous power value corresponding to the n-th sampling, and 1/G is a constant, with 1/G<<1.

Since constant 1/G is set such that 1/G<<1, lafter the calculation of equation (2) is repeated upon each application of value b(n) to arithmetic means 12, there is obtained the waveform shown in FIG. 2(4).

Calculation of equation (2) means obtaining difference between instantaneous power value b(n) corresponding to the n-th sampling and the last mean value P(n−1) covering the n−1 sampling, and multiplying the difference {b(n)−P(n−1)} by the constant 1/G. Since 1/G<<1, calculation of (1/G)·{b(n)−P(n−1)} means to dilute the difference between the just sampled value and the last mean value P(n-1). The thus diluted difference is added to the last mean value P(n-1) to provide present means value P(n) covering the n samplings. By repeating the calculation of equation (2) a large number of times, there is obtained the mean value of the waveform under sampling.

That is, repetition of calculation of equation (2) makes value P(n) approach the mean value of waveform b(n). Thus, the final value of the waveform shown in FIG. 2(4) conforms with the mean value, i.e. the effective power value, of instantaneous power waveform b(n) shown in FIG. 2(3). In other words, the effective power value can be obtained from arithmetic means 12.

Since the instantaneous value, which is in digital form in the embodiment, corresponding to the sampled values is subjected directly to exponential averaging calculation, the condition that the integral multiple of one cycle Tin of the input waveform should be in accord with the integral multiple of the sampling period $T_{AD}$ is not required. Thus, the problem of the prior art are solved by the invention.

Figure 3:
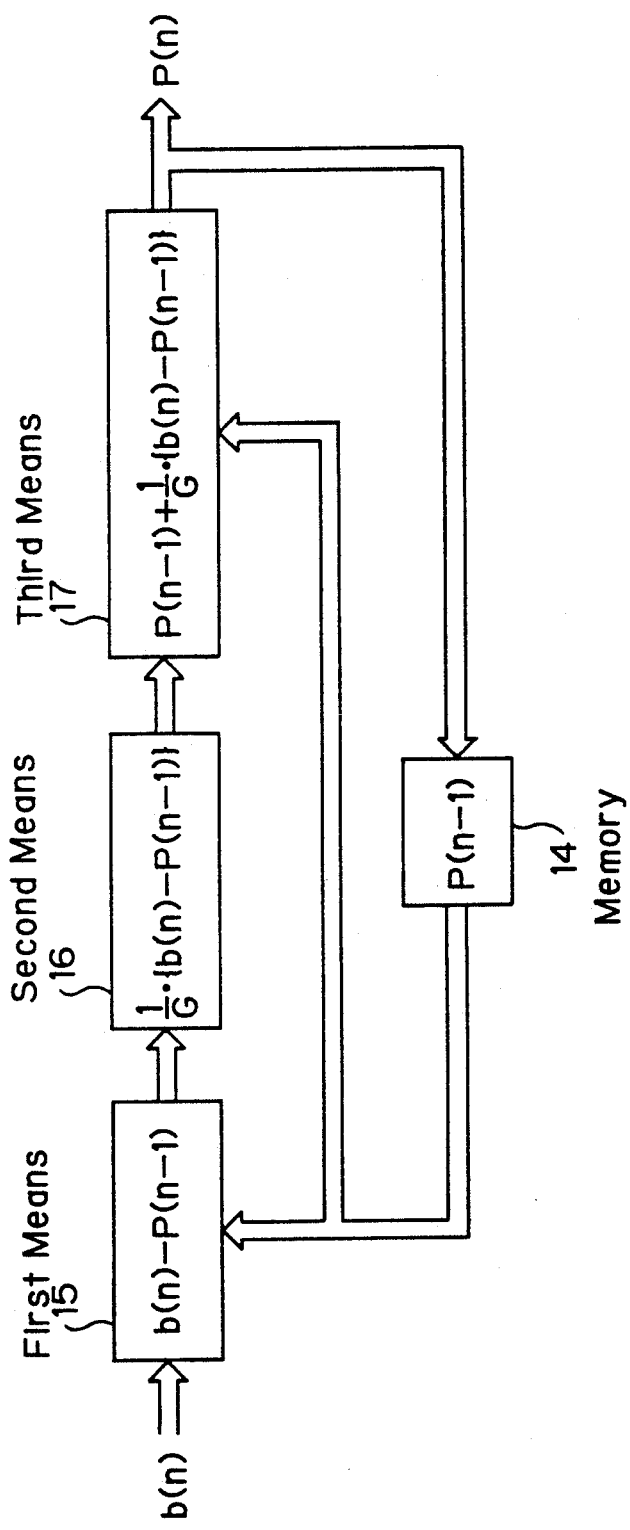
FIG. 3 is a schematic diagram depicting an illustrative averaging means of the invention.

FIG. 3 shows an averaging means 8, which handles digital calculations and includes three arithmethic blocks or means. A first means 15 receives, from memory 14 (which is also shown in FIG. 1) last mean value P(n-1) covering n-1 samplings, receives from multiplier 11 instantaneous power value b(n) corresponding to the n-th sampling, and calculates the difference {b(n)−P(n−1)} between the two received values.

A second means 16 multiplies the output {b(n)−P(n−1)} of first means 15 by the constant 1/G to provide the value (1/G)·{b(n)−P(n−1)}. The vlaue of the constant 1/G is previously set by, for example, the user of the device of FIG. 1.

A third means 17, calculates the sum P(n)=P(n−1)+(1/G)·{b(n)−P(n−1)} of the last mean value P(n-1) supplied from memory 14 and the output of second means 16, and stores the thus calculated present mean value P(n) in memory 14. In other words, third means 16 provides the present means value P(n), as expressed by equation (2), which covers samplings.

Figure 4:
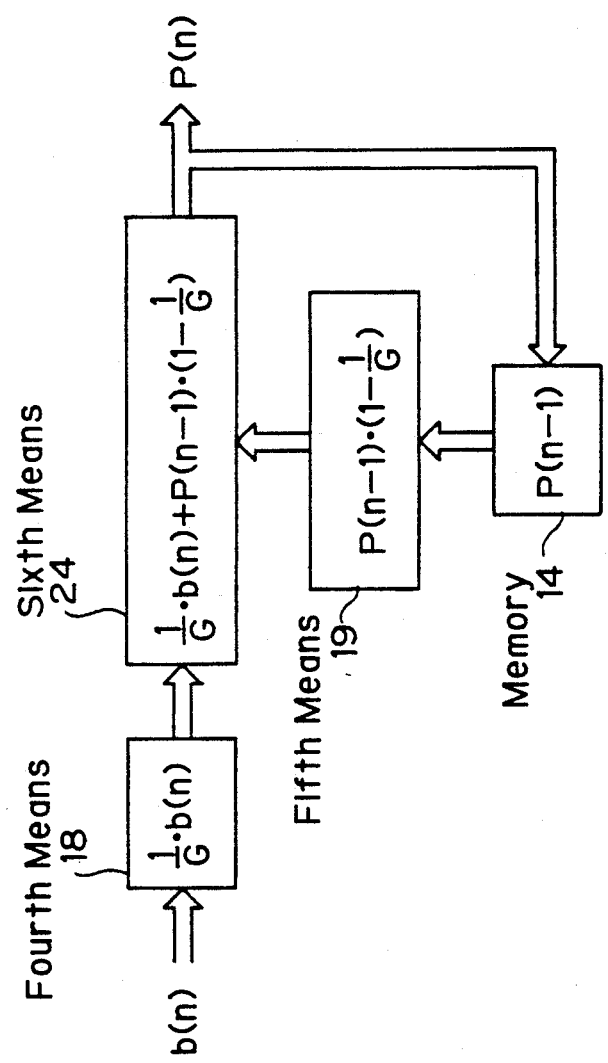
FIG. 4 is a schematic diagram depicting another illustrative embodiment of the invention averaging means.

FIG. 4 depicts another illustrative averaging means 8 having a configuration complying with equation (3) which is a rewritten form of equation (2). A fourth means 18 receives from multiplier 11 instantaneous power value b(n) corresponding to the n-th sampling, and multiplies it by a constant 1/G. A fifth means 19 receives from memory 14 last mean value P(n-1) and multiplies it by a factor of (1−1/G). A sixth means 24 adds the output values of fourth means 18 and fifth means 19 together to provide the sum (1/G)·b(n)+P(n−1)·(1−1/G).

$$P(n)=(1/G)\cdot b(n)+P(n-1)\cdot(1-1/G) \qquad (3)$$

The foregoing functions of multiplier 11 and arithmetic means 12 can be attained by use of, for example, a digital signal processor.

A central processing unit 20, referred to as a CPU, receives the output value P(n) of arithmetic means 12 and after calculation is repeated a given number of times or the value P(n) reaches steady state causes display unit 21 to display the value, P(n), that is the effective power value. The waveform of FIG. 2(40 represents output vlaue P(n) of arithmetic means 12 in analog form. It should be noted that the number of calculations is in accord with the number of times the clock signal is applied, that is the number of samplings.

A divider 22 receives clock signal SC from clock generator 7, and after a given number of clock pulses are received, sends a signal to CPU 20 to notify the CPU that a given number of calculations have been performed.

The display unit 21 displays the effective power value P(n) under control of CPU 20.

Figure 12:
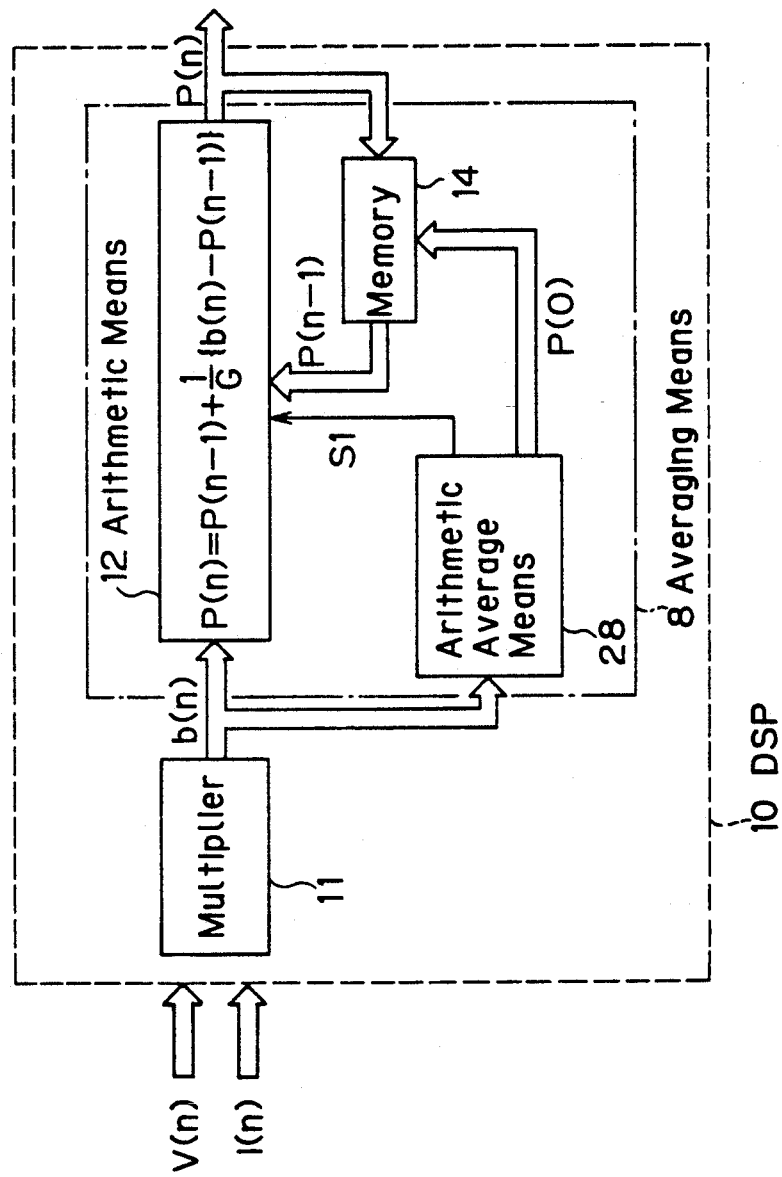
FIG. 12 is a schematic diagram depicting still another illustrative embodiment of the invention.

The operation of the device shown in FIG. 1 will now be described with reference to FIGS. 2(1)–2(5), wherein FIG. 2(1) shows the waveform of analog input voltage V; FIG. 2(2) depicts the waveform of analog current i; FIG. 2(3) depicts the waveform in analog form of instantaneous power value b(n); FIG. 2(4) depicts the waveform in analog form of exponential mean value P(n) provided by averaging means 8; and FIG.2(5) depicts the waveform of exponential mean value P(n) provided by a different averaging means, such as shown in FIG. 12.

In FIG. 1, assume that at moment TS (see FIG. 2(1)), the analog input voltage waveform and the analog input current waveform with a phase difference therebetween, as shown in FIGS. 2(1) and 2(2), are applied to terminals P1 and P2, respectively.

Since clock signal SC of period $T_{AD}$ is applied by clock generator 7 to the two S/H circuits 1, 2, the sampling is performed at the same timing. Consequently, values V(1), V(2), V(3) . . . , i(1), i(2), i(3), . . . , are picked up at points marked "x" in FIGS. 2(1) and 2(2), and successively converted into digital form ADC 3, 4.

Since delay lines 5,6 delay the clock signal SC a short time, the ADC 3,4 can receive the values from S/H circuits 1,2 which are held in a stable hold state.

ADC 3 provides digital values V(n) corresponding to sampled values V(1), V(2), V(3), . . . shown in FIG. 2(1), and the ADC 4 provides digital values i(n) corresponding to sampled values i(1), i(2), i(3), . . . , shown in FIG. 2(2), wherein n=1,2,3 . . .

Multiplier 11 multiplies together the two values picked up at the same sampling timing, to provide instantaneous power value b(n)=V(n) i(n). The solid line stepped waveform shown in FIG. 2(3) represents the thus obtained instantaneous power value b(n) in analog form.

Arithmetic means 12 receives value b(n) shown in FIG. 2(3) and performs calculation of either equation (2) or equation (3). The thus obtained exponential mean value P(n) is plotted in FIG. 2(4). The finally converged value of mean value P(n) represents the effective power value, which is also referred to as the mean power value.

Although FIG. 2(4) shows the curve of exponential mean value P(n) as if it takes a fixed value within an interval of time corresponding to a small number of samplings, or calculations, in actual operation, about 1000 calculations are normally needed before the value becomes fixed.

After a given number (e.g. 1000) of calculations are performed, divider 22 sends a signal to CPU 20. Consequently, CPU 20 reads present mean value P(n) and causes display unit 21 to display the effective power value.

Figure 5:
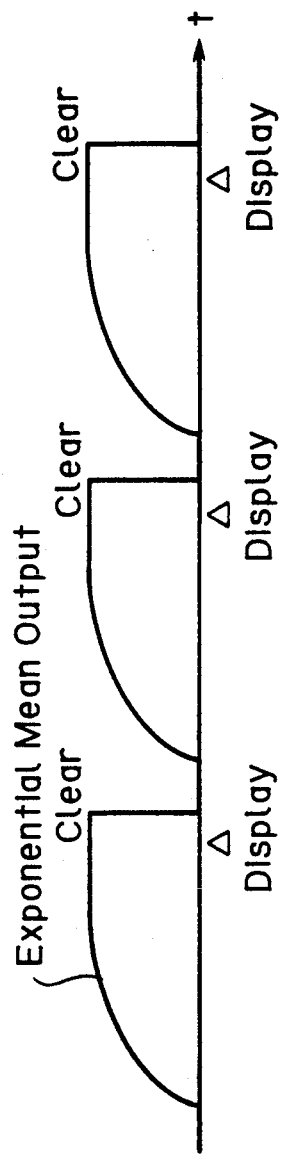
FIG. 5 is a timing diagram depicting the relationship between calculated mean value and display moment.
Figure 6:
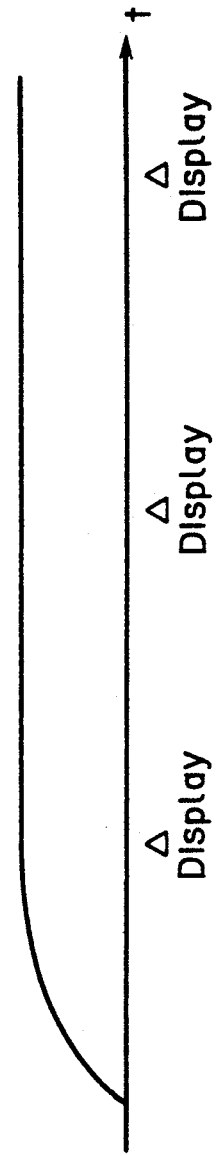
FIG. 6 is a timing diagram depicting another relationship between calculated mean value and display moment.

The sampling type measuring device of the invention can utilize either of the two display methods shown in FIGS. 5, 6. According to the display method of FIG. 5, at each point marked "Δ", where the mean value P(n) reaches the final value or comes close to it, the value at that point is displayed, and the display of the display unit is renewed, then the content of memory 14 is cleared and the value P(n-1) is set to zero, and then calculation is restarted with value equal to zero. According to the display method of FIG. 6, without clearing the content of memory 14, present mean value P(n) is displayed each time a given number of calculations is reached.

Figure 8:
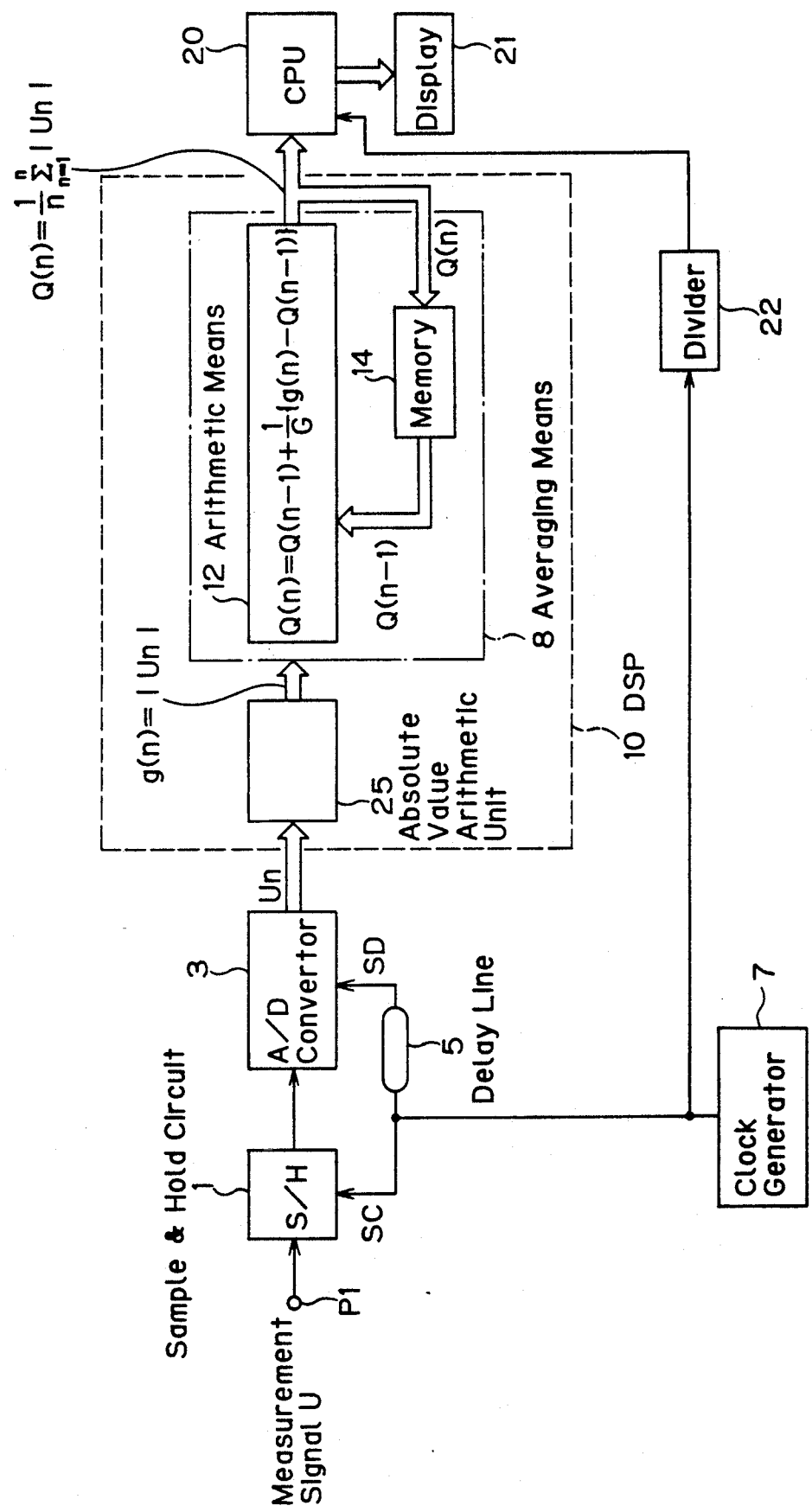
FIG. 8 is a block diagram depicting another illustrative embodiment of the invention as embodied in the form of a mean value rectifying type measuring device.

FIG. 8 depicts another embodiment of a mean value rectifying type measuring device, which is designed to rectify an AC signal in a full-wave or half-wave mode, and to calculate the mean value of the resulting waveform. The device shown in FIG. 8 utilizes the full-wave mode and calculates the mean value of the resulting waveform.

S/H circuit 1, ADC 3, delay line 5, clock generator 7, averaging means 8, CPU 20, display unit 21, and divider 22 shown in FIG. 8 are similar to the same elements shown in FIG. 1 and bear the same reference symbols. The difference between the two figures is that FIG. 8 includes no components corresponding to S/H circuit 2, ADC 4, and delay line 6, and further that in addition, FIG. 8 includes an absolute value arithmetic unit 25 in place of the multiplier 11. The mutual connection between S/H circuit 1, ADC 3, delay line 5, and clock generator 7 of FIG. 8 is the same as that in FIG. 1.

Upon receipt of clock signal SC, S/H circuit 1 samples measurement signal U at the timing defined by the clock signal. The measurement signal U may be in analog input voltage or current form. Upon receipt of each signal SD passed through delay line 5, ADC 3 converts a signal sampled by S/H circuit 1 into a digital value Un. That is, digital value Un represents the instantaneous value of measurement signal U.

Absolute value arithmetic unit 25 receives the value Un from ADC 3 and provides absolute value $g(n)=|Un|$ of value Un. Since output Un of ADC 3 is in digital form, absolute value arithmetic unit 25 provides the amplitude value in digital form of value Un. Absolute value $g(n)=|Un|$ which is the output of absolute value arithmetic unit 25 represents the instantaneous value in digital form of the waveform obtained by rectifying the measurement signal U in the full wave rectification mode.

Averaging means 8 shown in FIG. 8 is similar to the averaging means 8 of FIG. 1, and performs calculation of below equation (4). Specifically, the averaging means in FIG. 8 receives from absolute value arithmetic unit 25 absolute value g(n) corresponding to the instantaneous value, receives a last mean value Q(n-1) calculated by itself which covers the n-1 samplings, and performs calculation of equation (4) using a preset constant 1/G, thereby providing a present mean vlaue Q(n) covering the n samplings.

$$Q(n)=Q(n-1)+(1/G)\cdot\{g(n)-Q(n-1)\} \quad (4)$$

wherein Q(n) is the exponential mean value covering n samplings, Q(n-1) is the exponential mean value covering the n-1 samplings, g(n) is the absolute value corresponding to the n-th sampling, and 1/G is a constant where $1/G<<1$.

Equation (4) is analogous to Equation (2); that is, Q(n) corresponds to P(n), Q(n-1) corresponds to P(n-1), g(n) corresponds to b(n), and 1/G corresponds to 1/G. Thus, averaging means 8 in FIG. 8 provides an exponential mean value of absolute value $g(n)=|Un|$ of the measurement signal, which is obtained by subjecting signal U to mean value rectification.

Averaging means 8 in FIG. 8 may comprise a combination of arithmetic means 12, and memory 14, as in FIG. 1. Furthermore, averaging means 8 may take the configuration of FIG. 3 or FIG. 4, as in the case of averaging means 8 of FIG. 1.

CPU 20 receives output Q(n) of arithmetic means 12, and after a given number of calculations, causes display unit 21 to display value Q(n) having arrived at steady state as shown in FIG. 9(3). It should be noted that the number of calculations conforms to the number of pulses of the clock signal, that is the number of samples. The divider 22 receives clock signal SC from clock generator 7, and after a given number of clock pulses are received, sends a signal to CPU 20 to notify it that a given number of calculations have been performed. Display unit 21 displays mean value Q(n) of rectification of the measurement signal U under control of CPU 20.

The operation of the embodiment of FIG. 8 will now be described with reference to FIGS. 9(1)-9(4), wherein FIG. 9(1) depicts the waveform of measurement signal U, FIG. 9(2) depicts the waveform in analog form of absolute value g(n) of the sampled value, FIG. 9(3) depicts the waveform in analog form of the exponential mean value Q(n) provided from the averaging means 8, and FIG. 9(4) depicts the number of samples.

In FIG. 8, assume that at moment TS(see FIG. 9(3) the waveform of measurement signal U, as shown in FIG. 9(1), is applied to terminal P1.

Upon receipt of each clock signal SC of period $T_{AD}$ from clock generator 7, S/H circuit 1 performs sampling to send the value sampled at each point marked "X" on FIG. 9(1) to ADC 3. ADC 3 converts each received value into digital values U1, U2, U3, ... Un( see FIG. 9(1)).

Absolute value arithmetic unit 25 provides the absolute value $g(n)=|Un|$ of instantaneous value Un received. That is, absolute value arithmetic unit 25 provides the digital amplitude value of value Un. The solid line stepped waveform of FIG. 9(2) shows the thus obtained absolute value g(n) in analog form. The broken line waveform of FIG. 9(2) shows the ideal full wave rectified waveform of FIG. 9(1).

Arithmetic means 12 receives the value g(n) of FIG. ((2) and performs calculations of equation (4). The thus obtained exponential mean value Q(n) is plotted in FIG. 9(3). The finally converged value Q(M) of mean value Q(n) represents the mean value of the rectified waveform of the measurement signal U.

Figure 10:
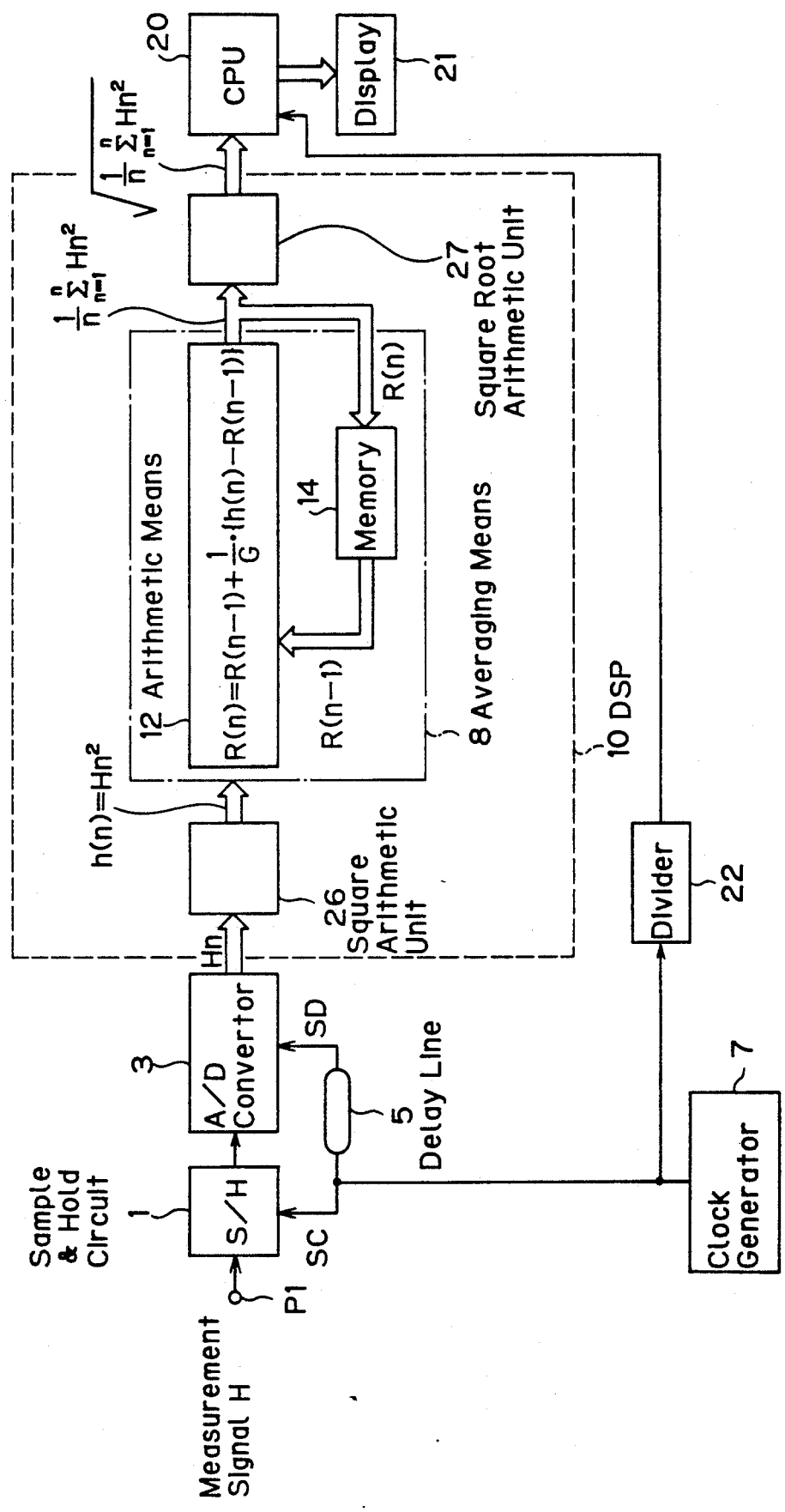
FIG. 10 is a block diagram depicting still another illustrative embodiment of the invention as embodied in the form of an effective value measuring device.

FIG. 10 depicts an illustrative effective vlaue measuring device of the invention, wherein S/H circuit 1, ADC 3, delay line 5, clock generator 7, averaging means 8, CPU 20, display unit 21 and divider 22, are similar to those shown in FIG. 1, but differs therefrom in that FIG. 10 omits the S/H circuit 2, ADC 4, and delay line 6, and furthermore FIG. 10 includes a square arithmetic unit in place of the multiplier 11 of FIG. 1, and additionally includes a square root arithmetic unit 27 which receives the output of averaging means 8 and performs square root calculation thereon. Also, the mutual connection between S/H circuit 1, ADC 3, delay line 5, and clock generator 7 in FIG. 10 is similar to that in FIG. 1.

Upon receipt of clock signal SC, S/H circuit 1 samples the measurement signal H at the timing defined by clock signals to pick up an instantaneous value. The measurement signal H may be in the form of an analog input voltage or current signal. Upon receipt of each signal SD passed through the delay line 5, ADC 3 converts the instantaneous value sampled by the S/H circuit 1 into a digital value Hn.

Square arithmetic unit 26 receives the value Hn from the ADC 3 and provides square value $h(n) = H_n^2$ of the value Hn. That is, the square value of instantaneous value Hn corresponding to the n-th sampling is provided from square arithmetic unit 26.

Averaging means shown in FIG. 10 is similar to that shown in FIG. 1, and performs calculations of equation (5), hereinbelow given. Specifically, averaging means 8 receives the square value h(n) from square arithmetic unit 26, receives a last mean value R(n-1) calculated by itself which covers the n-1 samplings, and performs calculation of equation (5) using a preset constant 1/G, thereby providing a present means value R(n) covering the n samplings.

$$R(n) = R(n-1) + (1/G) \cdot \{h(n) - R(n-1)\} \quad 5)$$

wherein R(n) is the exponential mean value covering n samplings, R(n-1) is the exponential mean value covering n-1 samplings, h(n) is the absolute value corresponding to n-th sampling, and 1/G is a constant, where $1/G < 1$.

Equation (5) is analogous to equation (2), in that, R(n) corresponds to P(n0, R(n-1) corresponds to P(n-1); h(n) corresponds to b(n), and 1/G corresponds to 1/G. The averaging means 8 of FIG. 10 provides mean value $$(1/n) \cdot \sum_{n=1}^{n} H_n^2$$

of the square value $h(n) = H_n^2$ of the measurement signal H.

Averaging means 8 in FIG. 10 may comprise arithmetic means 12 and memory 14, as in FIG. 1. Moreover, averaging means 8 may take the configuration of FIG. 3 or 4, as in the case with FIG. 1.

Figure 11:
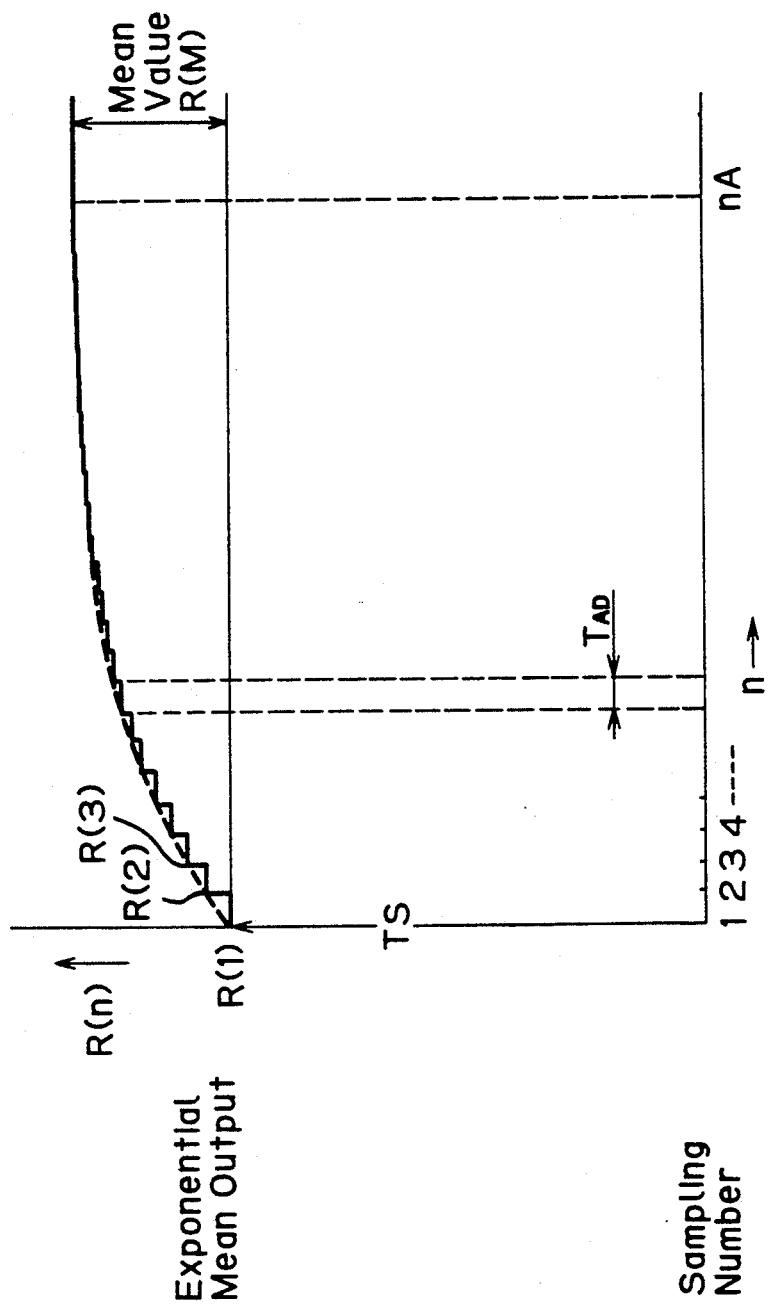
FIGS. 11(1)-11(4) are waveform diagrams depicting signal waveforms at several points in the embodiment of FIG. 10.

Square root arithmetic unit 27 receives the value R(M) =

$$(1/n) \cdot \sum_{n=1}^{n} H_n^2$$

which finally becomes fixed after a given number of calculations performed in averaging means 8 (see FIG. 11(4), item nA), and calculates the square root of the value R(M), thereby providing the effective value $$\sqrt{(1/n) \cdot \sum_{n=1}^{n} H_n^2}$$

of the measurement signal H. Square root arithmetic unit 27 for obtaining the square root of a received signal is known in the art. Thus, its details need not e descried hereat.

CPU 20 receives the value $$\sqrt{(1/n) \cdot \sum_{n=1}^{n} H_n^2}$$

from square root arithmetic unit 27 and causes display unit 21 to display such value. That is, display unit 21 displays the effective value $$\sqrt{(1/n) \cdot \sum_{n=1}^{n} H_n^2}$$

of the measurement signal H under control of CPU 20.

The operation of the embodiment of FIG. 10 will now be described with reference to FIGS. 11(1)–11(4), wherein FIG. 11(1) depicts the waveform of measurement signal H; FIG. 11(2) depicts the waveform in analog form of square value h(n) of the sampled value, i.e. instantaneous value, shown in FIG. 11(1); FIG. 11(3) depicts the waveform in analog form of the exponential mean value R(n) provided form the averaging means 8; and FIG. 11(4) depicts the number of samplings.

In FIG. 10, assume that at moment TS (see FIG. 11(3)), the waveform of the measurement signal H as shown in FIG. 11(1) is applied to terminal P1.

Upon receipt of each clock signal SC of period $T_{AD}$ from clock generator 7, S/H circuit 1 performs sampling to send the value picked up at each point marked "X" in FIG. 11(1) to ADC 3. ADC 3 converts each received value into digital values H1, H2, H3, Hn (see FIG. 11(1)).

Square arithmetic unit 26 provides square value $h(n) = H_n^2$ of digital value Hn. The solid line stepped waveform of FIG. 11 (2) shows the thus obtained square value h(n) in analog form. The waveform is stepped because it is based on the sampled value. The broken line waveform of FIG. 11(2) shows an ideal square waveform corresponding to the waveform of FIG. 11(1).

Arithmetic means 12 receives the value h(n) of FIG. 11(2) and performs calculation of equation (5). The thus obtained exponential mean value R(n) is plotted in FIG. 11(3). The finally converged value R(n) (for example, the mean value corresponding to the n-th sampling, see FIG. 11(4)) is sent to square root arithmetic unit 27, in which the square root of the mean value is calculated, so that effective value $$\sqrt{(1/n) \cdot \sum_{n=1}^{n} H_n^2}$$

of measurement signal H is provided.

FIG. 12 shows another averaging means, usable in the invention, which is capable of enhancing obtaining of the exponential mean value. Averaging means of FIG. 12 is designed for use in the sampling type wattmeter of FIG. 1. Thus, the signals V(n) and i(n) shown in FIG. 12 are those applied to ADC 3,4, shown in FIG. 1, and the value P(n) shown in FIG. 12 is applied to CPU 20 shown in FIG. 1.

Averaging means 8 of FIG. 12 differs from that shown in FIG. 1 in that there is additionally included an arithmetic averaging means 28. The other configuration of FIG. 12 is similar to that of FIG. 1.

Arithmetic averaging means 28 functions to obtain the arithmetic mean value of a given number of values provided from multiplier 11. For example, when multiplier 11 provides values b(1), b(2), ..., b(k), the number of values k (which is usually a small number, e.g. 20), the following calculation is performed:

$$P(0) = \{b(1) + b(2) + b(3) + \ldots b(k)\}/k \quad (6)$$

Figure 7:
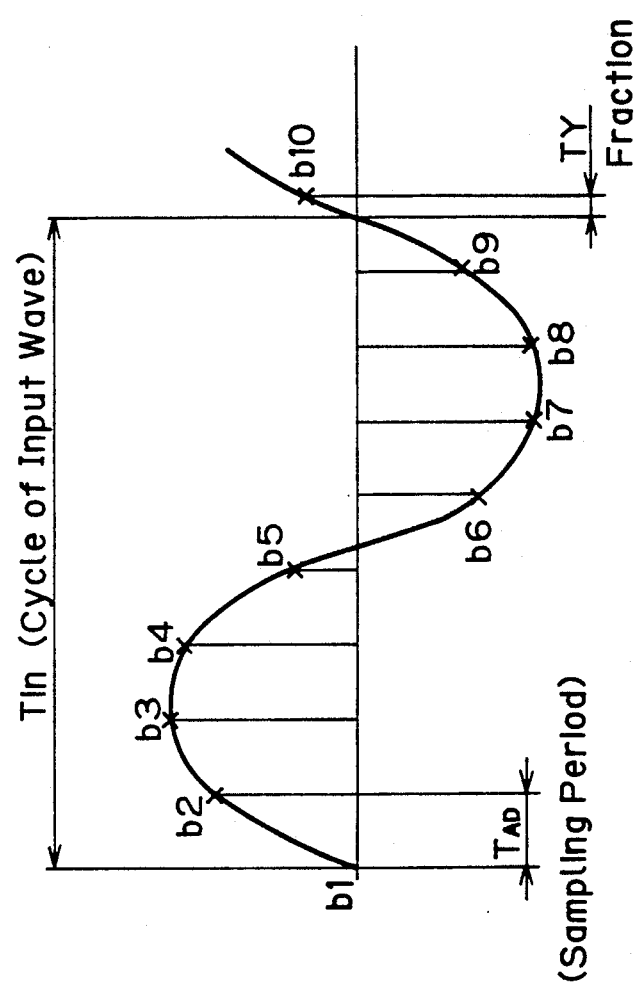
FIG. 7 is a waveform diagram for explaining the cause of error generation.

The results of the calculation, P(0), is stored in memory 14, as the initial value of equation (2). In this case, it makes no difference whether fraction TY shown in FIG. 7 takes an appreciable width or not. The reason is that setting the initial value P(0) to a round value makes no difference. When initial value P(0) is obtained, together with it, a signal S1 notifying the delivery of the initial value P(0), and initial value P(0) are sent to arithmetic means 12.

The operation of the sampling type measuring device including averaging means 8 of FIG. 12 will now be described with reference to FIGS. 2(1)–2(5). At moment TS, the analog input voltage waveform and analog input current waveform with a phase difference therebetween, as shown in FIGS. 2(1) and 2(2), are applied to terminals P1 and P2, respectively. On the other hand, clock signal SC is applied from clock generator 7 to S/H circuits 1,2, so that sampling is performed concurrently in these circuits. The resulting sampled values are converted in ADC 3,4 into digital form, thereby providing instantaneous digital voltage value V(n) and instantaneous digital current value i(n) of the same timing.

Multiplier 11 multiplies these two values together to provide instantaneous value b(n) (see FIG. 2(3)). Specifically, multiplier 11 provides instantaneous power values b(1),b(2),b(3) ... in succession in synchronism with clock signal SC.

Arithmetic averaging means 28 has a number "k" set therein, decrements number k by one upon receipt of each of values b(1), b(2), b(3), ..., from the multiplier 11, and when k=0 is reached, calculates equation (6). That is to say, arithmetic averaging means 28 provides initial value P(0) which is the arithmetic mean value of the k values, and stores it in memory 14. Furthermore, arithmetic averaging means 28 sends signal S1, notifying the delivery of the initial value P(0) to arithmetic means 12. It should be noted that time TU shown in FIG. 2(5) indicates an interval of time until value P(0) of equation (6) is calculated.

In the example of FIG. 2(5), initial value P(0) is the arithmetic mean value of the four instantaneous power values b(1),b(2), b(3), and b(4) shown in FIG. 2(3). As will be appreciated from comparison of FIGS. 2(4) and 2(5), the rising speed of value P(0) obtained by arithmetic averaging (see FIG. 2(5) is much faster than that of the curve (see FIG. 2(4)) obtained by exponential averaging based on equation (2). That is to say, in the case of the device of FIG. 1, calculation is started with the initial vlaue P(0)=0, and the difference between the last mean value P(n-1) and the present sampled value b(n) is "diluted" by use of the constant 1/G, where 1/G<<1. Thus, the grade in variation of the curve of FIG. 2(4) is small. On the other hand, in the embodiment of FIG. 12, calculation is started with initial value P(0) equal to the foregoing arithmetic mean value P(0). Thus, the rising speed is quick.

Arithmetic means 12 in averaging means 8 of FIG. 12 performs no calculation or is quiescent during interval TU shown in FIG. 2(5). Upon receipt of signal S1 from arithmetic averaging means 28, arithmetic means 12 begins exponential averaging calculation according to equation (2). In this case, the relation P(n-1)=P(0) is adopted at the first calculation step of equation (2). In the example of FIG. 2(5), the first calculated by arithmetic means 12 handles the 5th sampling as follows:

$$P(5) = P(0) = (1/G) \cdot \{b(5) - P(0)\} \quad (7)$$

Subsequently, calculation of equation (2) is performed upon each delivery of the value from multiplier 11. Thus, as shown in FIG. 2(5), the effective power value can be converged faster than in the response waveform of FIG. (4).

The advantageous effects of the invention are as follows.

1. Since measurement can be performed irrespective of whether or not one cycle of the input waveform is in accord with the integral multiple of the sampling period, no circuit is needed for measuring one cycle of the input waveform. Further no means is needed for controlling the sampling period to correspond to an integral fraction of one cycle of the input waveform. Thus, cost reduction is attained.

2. Since it is not necessary to continue sampling and calculating until the integral multiple of one cycle Tin of the input waveform comes into accord with the integral multiple of the sampling period $T_{AD}$, the response time of measurement is never extended.

3. Since it is not necessary to shorten the sampling period, costly ADC circuits are not required.

4. Since the present mean value P(n) covering the n samplings is calculated on the basis of the last mean value P(n-1) covering the n-1 samplings (see equation (2)), or since the invention is not of the addition type system (see equation (1)), the object mean value can be renewed comparatively quickly in conformity with the change in magnitude of the measurement signal.

The foregoing description is illustrative of the principles of the invention. Numerous extensions and modifications thereof would be apparent to the worker skilled in the art. All such extension and modifications are to be considered to be within the spirit and scope of the invention.

What is claimed is:

1. A sampling type measuring device for measuring an analog input signal by sampling the analog input signal at a certain timing, converting each value picked up by sampling into digital form, and processing the digital values, said device comprising first analog to digital converter means for sampling an analog input voltage at said certain timing and coverting each value so sampled into digital form;

second analog to digital converter means for sampling an analog input current at said certain timing and converting each value so sampled into digital form;

multiplier means for multiplying together the output value of the first analog to digital converter means and the corresponding output value of the second analog to digital converter means to provide an instantaneous power value b(n), wherein the value b(n) corresponds to the n-th sampling; and averaging means for providing a present mean value of power P(n) covering n samplings, said averaging means comprising arithmetic means, and memory means, wherein said arithmetic means receives from said multiplier means the instantaneous power value b(n), and from said memory means a last mean value of power P(n-1), and calculates the present mean value of power P(n) from the two received values of b(n) and P(n-1) using the following equation $$P(n) = P(n-1) + (1/G) \cdot \{b(n) - P(n-1)\},$$

wherein G is a present constant and $1/G \gg 1$, and wherein said arithmetic means calculates the last mean value of power P(n-1) which covers the n-1 samplings and supplies it to said memory means.

* * * * *